US005559825A

United States Patent [19]

[11] Patent Number: 5,559,825

[45] Date of Patent: Sep. 24, 1996

Scalora et al.

[54] PHOTONIC BAND EDGE OPTICAL DIODE

[75] Inventors: Michael Scalora; Jonathan P. Dowling; Charles M. Bowden, all of Huntsville; Mark J. Bloemer, Athens, all of Ala.

[73] Assignee: The United States of America as represented by the Secretary of the Army, Washington, D.C.

[21] Appl. No.: 431,166

[22] Filed: Apr. 25, 1995

[51] Int. Cl.$^{6}$ .................................. G02B 1/10; H01S 3/08

[52] U.S. Cl. ............................ 372/96; 372/703; 359/584; 359/586; 359/588; 359/589

[58] Field of Search ................................ 372/96, 99, 703; 359/584, 586, 588, 589

[56] References Cited

U.S. PATENT DOCUMENTS 5,448,404 9/1995 Schrenk et al. ......................... 359/584

OTHER PUBLICATIONS

Yadava et al., "Optical Behaviour of Gradient Index Multilayer Films", Thin Solid Films, 21(2),1974 (no month available), pp. 297–312.

*Primary Examiner*—Rodney B. Bovernick
*Assistant Examiner*—Robert M. Nutt
*Attorney, Agent, or Firm*—Anthony T. Lane; Hay Kyung Chang

[57] ABSTRACT

A new optical diode is disclosed that permits unidirectional transmission of light, the direction of transmission depending on the direction of incidence. The diode comprises a stack of alternating layers of a low-index material and a high-index material. The layers are arranged within the stack such that there is spatial anisotropy of optical pathlengths in the stack and at least the low-index layers or the high-index layers have an optical nonlinearity, either inherently or by doping. At sufficiently high incident intensifies and appropriate wavelengths, such a diode exhibits partial transmission of input light incident from one direction while reflecting almost totally input light incident from the opposite direction.

6 Claims, 4 Drawing Sheets n
1.5
1.4
1.3
1.2
1.1
1.0
0
2
4
6
8
z/λ

PHOTONIC BAND EDGE OPTICAL DIODE

The invention described herein may be manufactured, used and licensed by or for the Government for governmental purposes without the payment to us of any royalties thereon.

BACKGROUND OF THE INVENTION

Recent years have seen substantially increased interest in photonic bandgap (PBG) materials because of their apparent analogies with semiconductors and their potential to revolutionize photonics.

SUMMARY OF INVENTION

A new optical diode is created that permits unidirectional propagation of electromagnetic radiation. The diode is created by introducing anisotropies into the linear refractive indices of a photonic bandgap structure in which either or both of the high-index layers and low-index layers have nonlinear response to incident radiation. The result is the transmission of electromagnetic radiation that impinges on the structure from one·direction while radiation that approaches from the opposite direction is almost totally reflected.

DESCRIPTION OF THE PREFERRED EMBODIMENT

Figure 1:
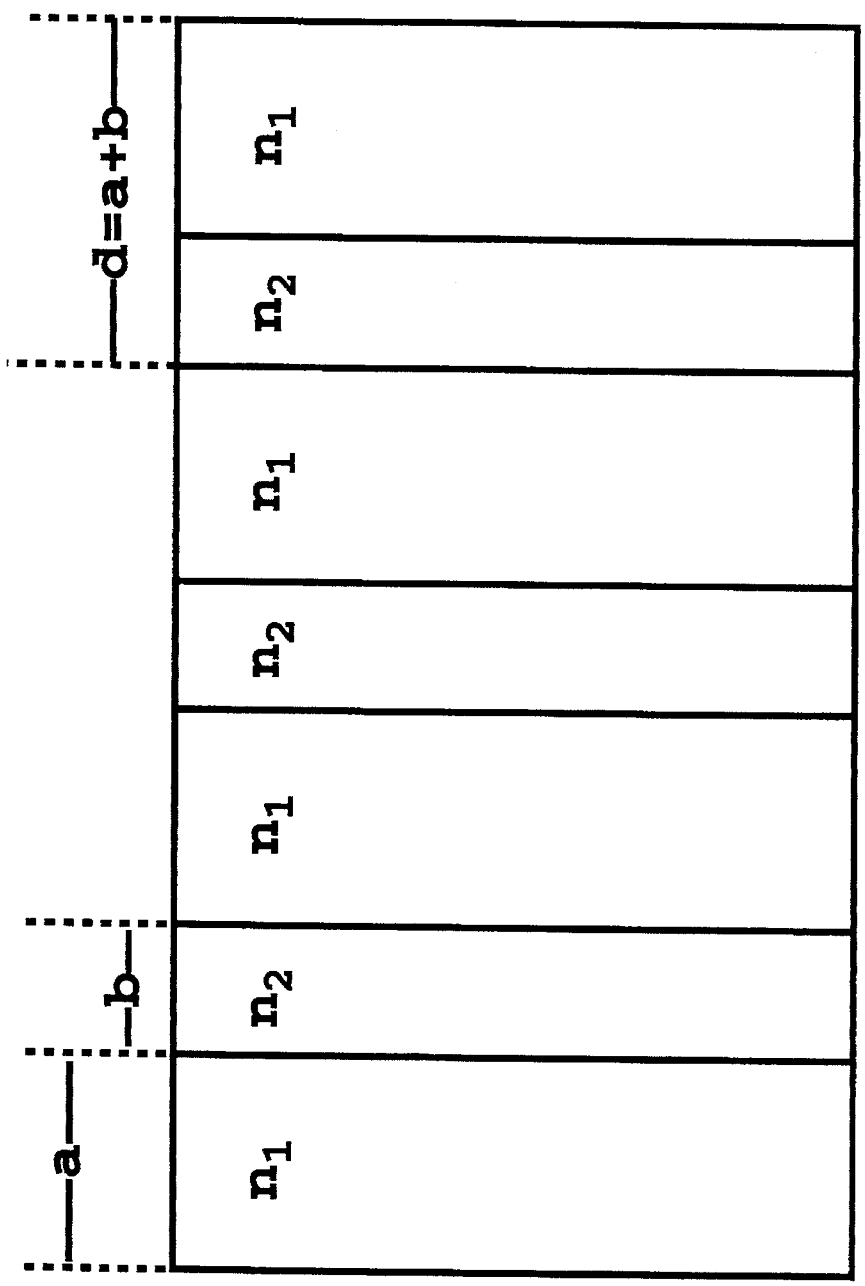
FIG. 1 is a diagram of a typical one-dimensional photonic bandgap structure.

A typical one-dimensional PBG structure comprises a multi-layer stack of dielectric material, the layers being arranged in such a way that the low-index layers ($n_1$) and high-index layers ($n_2$) alternate and the thickness of each layer is described by: $a=4n_1/\lambda$ and $b=4n_2/\lambda$ where a and b are the thicknesses of the low-index layer and high-index layer, respectively, and $\lambda$ denotes the free space wavelength. Such a structure is depicted in FIG. 1. A suitable material for $n_1$ layers may be a light flint glass while a material such as dense flint may be appropriate for $n_2$ layers. The structure depicted in FIG. 1 inhibits propagation therethrough of a finite range of wavelengths centered about $\lambda$, thus forming a photonic bandgap, which is analogous to electronic bandgap in semiconductors.

If on a structure such as is depicted in FIG. 1, electromagnetic radiation is incident whose carrier frequency is well within the forbidden photonic bandgap and whose linewidth is finite, the radiation cannot detect a gap unless it probes several dielectric layers before being reflected. If the carrier frequency of the light is tuned to the band edge, some component frequencies may actually fall inside the gap while others fall in the propagation band. This is due to the finite linewidth of the radiation and the result is a partial transmission. The photonic band edge optical diode takes advantage of these effects.

The explanation of the configuration and operation of the photonic band edge optical diode is facilitated by reference to the figures wherein like numbers refer to like parts.

Figure 2:
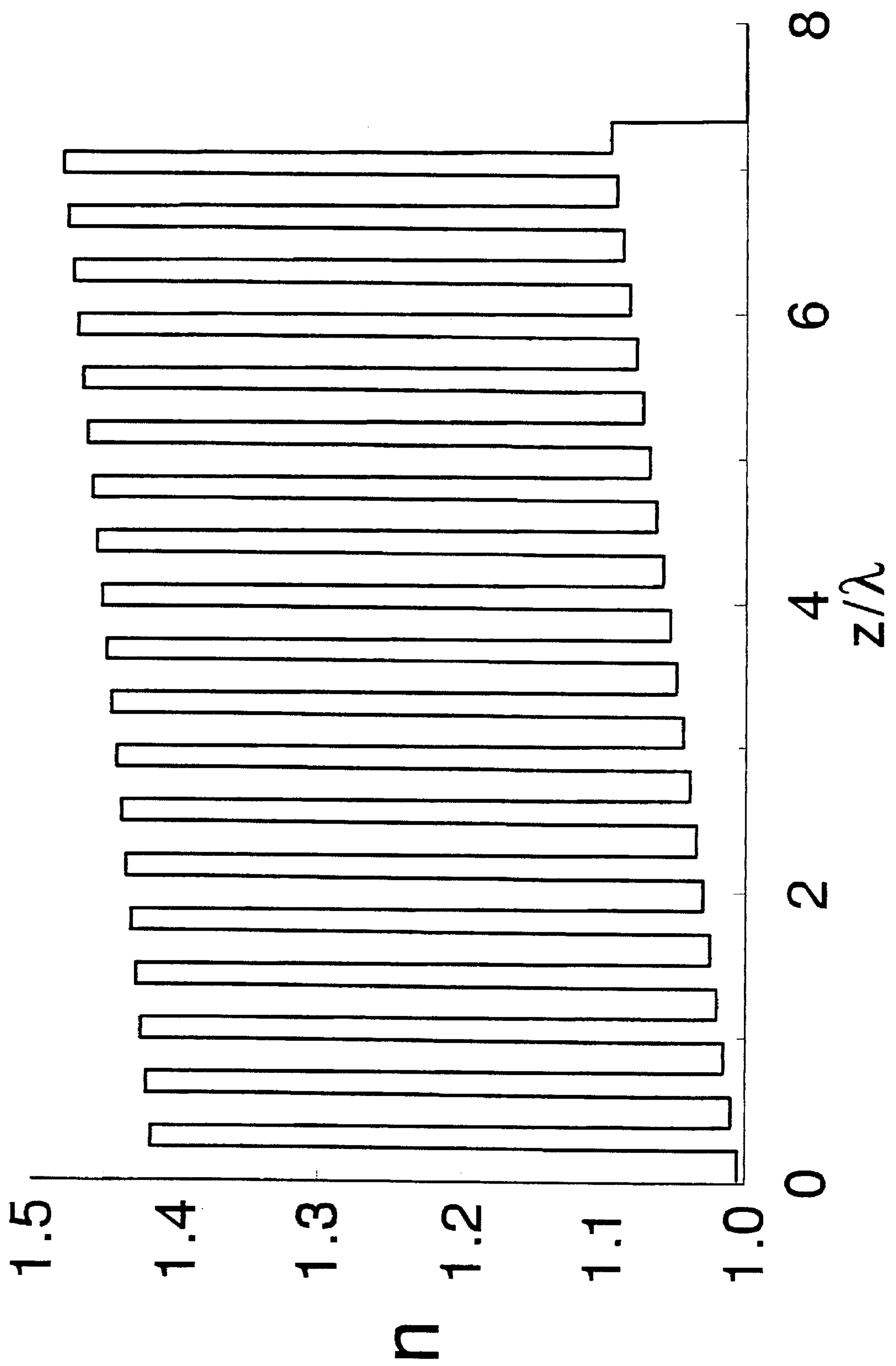
FIG. 2 illustrates the increasing index profile of the photonic band edge optical diode in its preferred embodiment.

The nonlinearity, which is one of two necessary conditions for the diode function, is achieved by fabricating either the high-index or low-index layers of FIG. 1 out of a nonlinear material. An alternate means is to dope an otherwise linear group of layers (either the low or high-index layers) with a nonlinear $\chi_3$ medium. The diode behavior also occurs when both groups of layers have nonlinear characteristics. The other necessary condition is that the alternating low and high-index layers, as shown in FIG. 1, exhibit an anisotropy in the optical pathlengths (optical pathlength= refractive index of the layer times the physical thickness of the layer). One way to achieve such an anisotropy is to increase gradually the indices of the low and high-index layers in one direction within the stack by a uniform value over their respective preceding layers so that both maximum and minimum values of the indices of refraction gradually increase by a small amount $\delta$. Such a graduated index profile can be obtained by minute changes in the chemical composition of the layers and can be implemented by selected methods of layer fabrication. This increasing index profile is illustrated in FIG. 2 as a function of the longitudinal coordinate where "z" denotes the physical thickness of the diode. The initial index values of the first two layers represented at the left of the graph in FIG. 2 are $n_1=1$ and $n_2=1.41$. The dielectric constant $\epsilon$ of either layer is related to the index of refraction by $\epsilon=n^2$. In the preferred embodiment of the diode represented in FIG. 2, the small increment in the dielectric constant of the layers is $\Delta\epsilon=0.01$. Further, the high index layers are doped with a medium whose refractive index depends upon the incident light intensity and is described by $n_2=n_o+\chi_3$ where $n_2$ denotes the high-index layer,$\chi_3$ is a small material coefficient, I is the incident light intensity which is itself proportional to the square of the applied optical field, E, via $I\propto E^2$ and $n_0$ is a constant background index for that layer without the dopant and high-intensity input pulse. If $\chi_3$ is positive, $\delta n=n_2-n_1$ increases while it decreases for negative $\chi_3$ coefficients. The thickness of each layer is chosen to be art appropriate fraction of the incident wavelength, i.e. $a=0.22\lambda$ and $b=1.41/0.22\lambda$. The gradually increasing values of the index of refraction along the longitudinal coordinate imply that the wavelength decreases according to the relation, $\lambda_{layer}=n_{layer}/\lambda$. The diode represented in FIG. 2 has a bandgap which can be mapped by propagating several incident test pulses of different wavelengths. It is noted that if the index difference $\delta$ were zero, $n_1$ and $n_2$ would be constant and the above choices of a and b would correspond to an incident pulse tuned to a point near the band edge of a quarter wave stack where nearly 50% transmission occurs. Transmission of 100 % can be achieved using continuous wave radiation at a band edge transmission resonance.

When a strong laser pulse capable of inducing nonlinear changes in the index of refraction is incident on the diode whose structure is represented in FIG. 2 (i.e. the high-index layers are doped with a negative $\chi_3$ coefficient), the pulse is partially transmitted if it is incident from the left side of the diode whereas it is almost totally reflected if it is incident from the right side. This unidirectional transmission phenomenon is due to both the graduated anisotropy of the optical pathlengths within the layers comprising the diode and to the nonlinear response of the high-index layers. If light is incident from the left, it tunnels through the layers as it excites the nonlinear medium response. This response causes the effective index difference δ between adjacent layers to be lowered and to push the local gap edge away from the radiation carrier frequency. The light, therefore, never "feels" a full gap and hence a partial transmission occurs. This is graphically shown in FIG. 3 where wave A indicates the incident wave and waves B and C represent the reflected and the transmitted portions, respectively, of the original input wave A. It is clear that transmitted portion is a significant fraction of the input wave. Such a transmission does not occur if the input wave approaches from the right side, however. In fact, the anisotropy of the optical pathlengths generates a large index step on the right side and, further, the wave cannot effectively penetrate the diode structure because it immediately finds itself in a local bandgap. As a result, the nonlinearity cannot be triggered sufficiently to move the band edge substantially, causing the input wave to be nearly completely reflected. This is illustrated in FIG. 4 where incident wave A approaches from the right but is almost entirely reflected as indicated by wave B.

Figure 3:
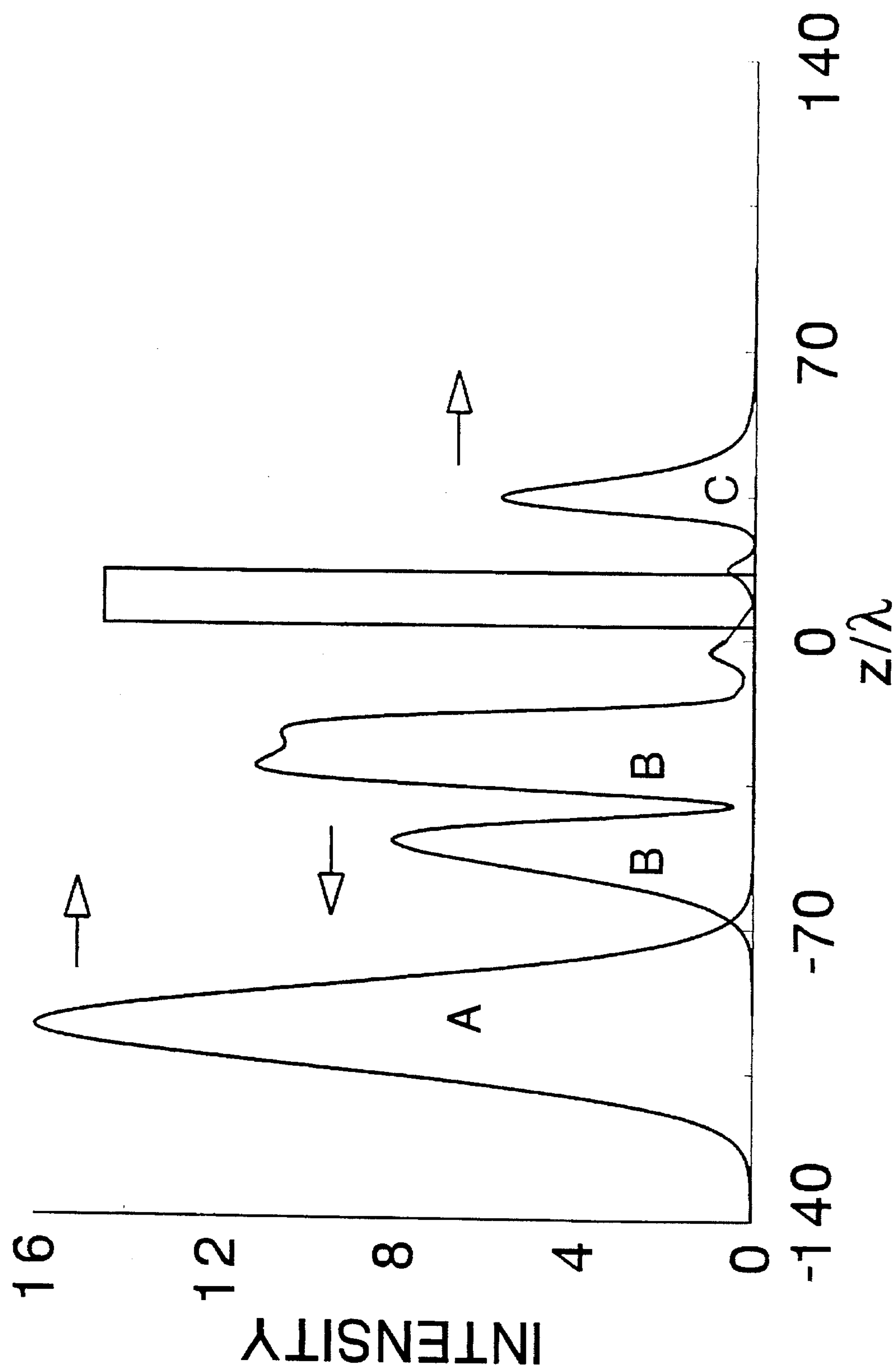
FIG. 3 is a graphic illustration of the partial transmission of an electromagnetic pulse that is incident on the diode from the left side.
Figure 4:
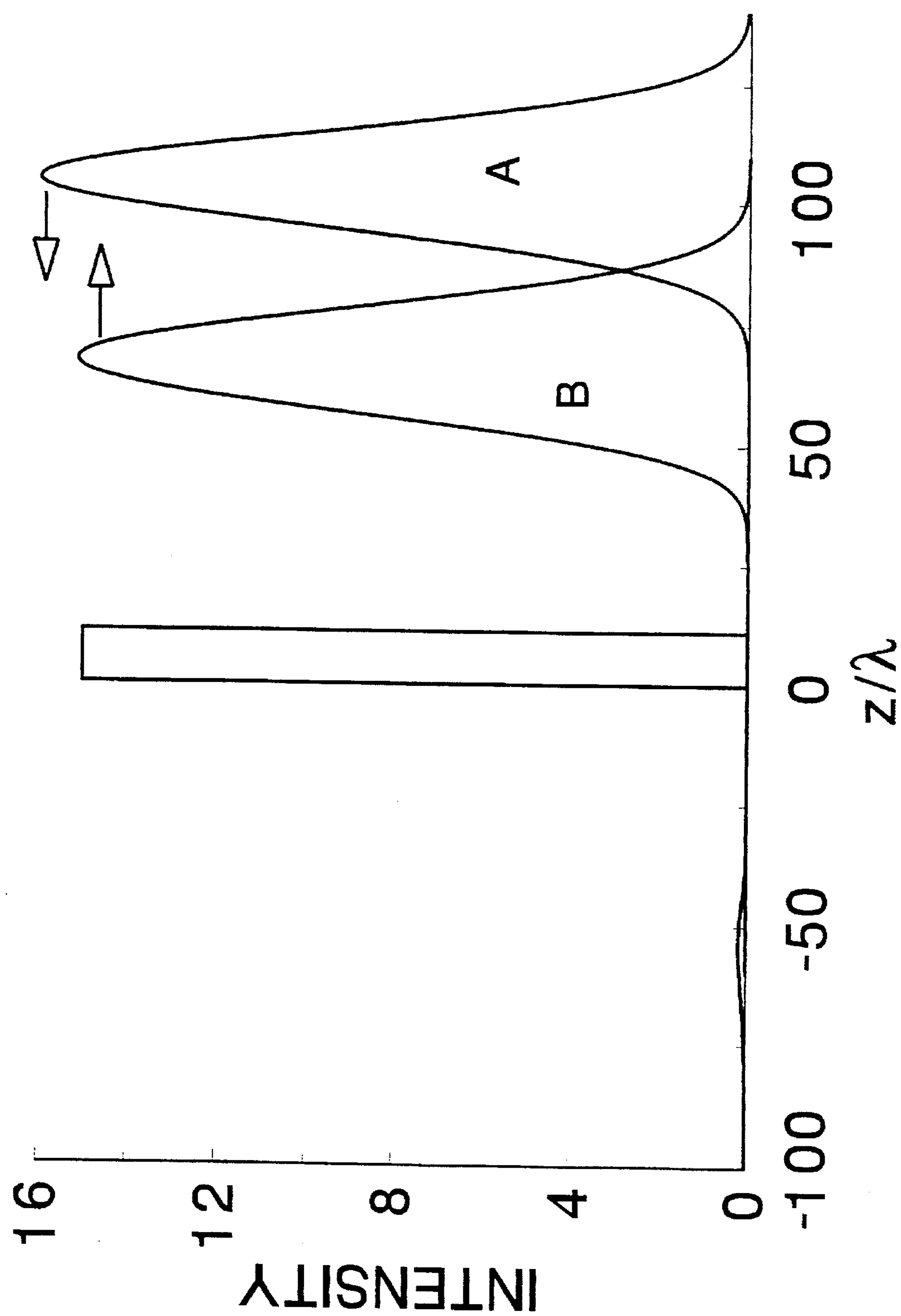
FIG. 4 is a graphic illustration of the nearly total reflection of an electromagnetic pulse that is incident on the diode from the right side.

In the diode, whose behavior is illustrated in FIGS. 3 and 4, the negative nonlinearity in the high-index layers causes the photonic band gap to shrink. The size of the gap shrinkage depends on which direction the light is propagating. The difference in the gap shrinkage between the left and right incident light is due to the asymmetry of the index profile as depicted in FIG. 2. For a negative nonlinearity in the high-index layers, the gap shrinkage is greater for radiation incident from the left than for radiation incident from the right. But if the nonlinearity has a positive sign, the photonic band gap widens due to the increase in δn. Nevertheless, the unidirectional transmittance is maintained, the only differences being in the direction of propagation (now reversed) and a slight shift in the operating wavelength. The reversal of direction is due to the greater gap expansion for waves incident frown the left than from the right. Furthermore, the nonlinearity need not be only in the high-index layers. (It may be in the low-index layers, or both of the low and high-index layers). What are necessary for the proper function of the photonic band edge optical diode are a spatially asymmetric photonic band gap medium and an optical nonlinearity in the medium. The asymmetry depicted in FIG. 2 is achieved by slight increase or graduation in the refractive index of each successive layer. Since the optical thickness of each layer is a product of the refractive index multiplied by the physical thickness of the layer, the optical thickness of each layer increases with increasing index of refraction, even if the physical thickness is kept constant. Ergo, the same effect can be achieved by increasing the physical thickness of each layer instead of increasing the refractive index. The choice between increasing the thickness of the layers or the refractive, index depends on the selected material and the chosen process for diode fabrication. Further, the increases in the optical thickness need not be uniform as long as there is left-to-right, spatial, optical asymmetry within the stack of layers thusly comprising the diode.

The diode can be made of semiconductors, polymers or glasses. The size of the surface area of the layers is not critical and various physical thicknesses of the layers may be used depending on the choice of the operating wavelength.

A related photonic bandgap structure is disclosed in a copending application, Ser. No. 08/357,465, titled "Photonic Band Edge Laser" by Jonathan P. Dowling, Michael Scalora, Mark J. Bloemer and Charles M. Bowden. It was filed on Dec. 16, 1994 and is assigned to the U.S. Government as represented by the Department of the Army.

Although a particular embodiment and form of this invention has been illustrated, it is apparent that various modifications and embodiments of the invention may be made by those skilled in the art without departing from the scope and spirit of the foregoing disclosure. Accordingly, the scope of the invention should be limited only by the claims appended hereto.

We claim:

1. A photonic band edge optical diode, said diode comprising: a plurality of first and second dielectric layers, said first and second dielectric layers having a first and second refractive indices, respectively; said second layers further having varying optical pathlengths and said second refractive index exhibiting an optically nonlinear dependence on the incident light; and said first layers and second layers being arranged in a stack such that they alternate and impart a spatial optical anisotropy to the entire stack, said optical nonlinear dependence and optical anisotropy together causing incident light to be transmitted through the stack predominantly in only one direction.

2. A photonic band edge optical diode as set forth in claim 1, wherein said second index of refraction is higher than said first index of refraction.

3. A photonic band edge optical diode as set forth in claim 2, wherein said first layers have varying optical pathlengths concurrently with said second layers.

4. A photonic band edge optical diode as set forth in claim 3, wherein said varying optical pathlengths comprise optical pathlengths that increase uniformly in one direction through the stack such that the optical pathlength of any given first layer is greater than that of the preceding first layer by $\Delta\epsilon_1$ and the optical pathlength of any given second layer is greater than that of the preceding second layer by $\Delta\epsilon_2$.

5. An optical diode as set forth in claim 4, wherein said first layers have nonlinearity concurrently with said second layers.

6. An optical diode as set forth in claim 5, wherein said $\Delta\epsilon_1$ and $\Delta\epsilon_2$ have the same numerical value.

* * * * *